(12) United States Patent
Suh et al.

(10) Patent No.: US 8,957,448 B2
(45) Date of Patent: Feb. 17, 2015

(54) LED PACKAGE AND FABRICATION METHOD OF THE SAME

(75) Inventors: Su Jeong Suh, Suwon-si (KR); Haw Sun Park, Suwon-si (KR)

(73) Assignee: Sungkyunkwan University Foundation for Corporate Collaboration, Suwon-si (KR)

( * ) Notice: Subject to any disclaimer, the term of this patent is extended or adjusted under 35 U.S.C. 154(b) by 0 days.

(21) Appl. No.: 13/433,356

(22) Filed: Mar. 29, 2012

(65) Prior Publication Data

US 2012/0248486 A1 Oct. 4, 2012

(30) Foreign Application Priority Data

Mar. 29, 2011 (KR) ................. 10-2011-0028187

(51) Int. Cl.
 *H01L 33/00* (2010.01)
 *H01L 33/48* (2010.01)
 *H01L 33/64* (2010.01)

(52) U.S. Cl.
 CPC ............ *H01L 33/486* (2013.01); *H01L 33/642* (2013.01); *H01L 2933/0033* (2013.01); *H01L 2933/0066* (2013.01); *H01L 2924/0002* (2013.01)
 USPC ............................. 257/99; 257/98; 257/100

(58) Field of Classification Search
 USPC .................................. 257/98–100
 See application file for complete search history.

(56) References Cited

U.S. PATENT DOCUMENTS

| 7,714,341 | B2 * | 5/2010 | Chil Keun et al. | 257/98 |
| 7,732,233 | B2 * | 6/2010 | Lin et al. | 438/28 |
| 2005/0139846 | A1 * | 6/2005 | Park et al. | 257/98 |
| 2009/0081867 | A1 * | 3/2009 | Taguchi et al. | 438/675 |
| 2009/0090926 | A1 * | 4/2009 | Wang et al. | 257/99 |
| 2010/0301359 | A1 * | 12/2010 | Liu | 257/98 |
| 2011/0049545 | A1 * | 3/2011 | Basin et al. | 257/98 |
| 2011/0057226 | A1 * | 3/2011 | Oberleither et al. | 257/98 |
| 2011/0284914 | A1 * | 11/2011 | Suzuki et al. | 257/99 |

FOREIGN PATENT DOCUMENTS

KR 10-2011-0009207 A 1/2011

* cited by examiner

*Primary Examiner* — Mark Tornow
(74) *Attorney, Agent, or Firm* — NSIP Law

(57) ABSTRACT

An LED package and method thereof include an insulation plate, and a metal board disposed on the insulation plate and etched to form a cavity, wherein the metal board is etched to partially expose the insulation plate to form the cavity. The LED package and method also include an LED chip configured to be mounted inside the cavity, and an encapsulation member filling the cavity, wherein the encapsulation member comprises an epoxy resin. The LED package and method include a through-hole configured to be formed on the insulation plate where the LED chip is mounted. The through-hole enables portions of the LED chip to be exposed, and a metal configured to fill the through-hole to form an electrode to be electrically connected to the LED chip.

8 Claims, 5 Drawing Sheets

LED PACKAGE AND FABRICATION METHOD OF THE SAME

CROSS-REFERENCE TO RELATED APPLICATION

This application claims the benefit under 35 U.S.C. §119(a) of Korean Patent Application No. 10-2011-0028187 filed on Mar. 29, 2011, in the Korean Intellectual Property Office, the entire disclosure of which is incorporated herein by reference for all purposes.

BACKGROUND

1. Field

The following description relates to an LED package and a method of fabricating the same, and more particularly, to an ultra-slim LED package having an improved heat dissipation effect and a simplified structure and a method of fabricating the same.

2. Description of Related Art

Light emitting diodes (LEDs) are light emitting devices configured to emit light when current is applied. LEDs are widely used in a variety of products, and the application fields thereof have been being continuously broadened.

Recently, as LEDs are applied to portable communication terminals, backlights of LCD products, etc, miniaturization of LED packages is required. As a result, surface mounted-type LED package are being developed.

However, because such an LED generates a large amount of heat during operation, it is difficult to miniaturize an LED package. An LED has a light efficiency in a range of between about 20% to about 30%. If it is assumed that an LED has light efficiency of about 30%, about 70% of power consumption for one LED may be emitted as heat. Due to the heat generated from the LED, a wire within the LED package may be short-circuited, or a junction of an LED chip may be delaminated. Thus, a life-expectancy of the LED may be reduced due to a limitation in which a junction between a wire and a terminal or an adhesion used for assembling the LED package is delaminated. Also, the heat generated from the LED may change characteristics of an encapsulation resin and a case to reduce transmittance and reflection of the LED or change characteristics of an LED chip to reduce LED efficiency.

Furthermore, in miniaturized LED packages, heat generated from LEDs is not sufficiently dissipated to cause serious limitations in heat dissipation.

Thus, a structure is needed of an LED package in which the use of wires or adhesions within the package can be minimized to reduce portions which are weak in heat, improve heat dissipation effects, and simplify manufacturing processes.

SUMMARY

In accordance with an illustrative configuration, an ultra-slim LED package is described having an improved heat dissipation effect and a simplified structure and a method of fabricating the same.

In accordance with a configuration, there is provided an apparatus, including an insulation plate, a metal board disposed on the insulation plate, and an LED chip disposed in a cavity defined in the metal board. The apparatus also includes an encapsulation member configured to fill the cavity in which the LED chip is disposed, and an electrode passing through the insulation plate. The electrode is electrically connected to the LED chip.

In accordance with another configuration, there is provided an LED package, including an insulation plate, and a metal board disposed on the insulation plate and etched to form a cavity, wherein the metal board is etched to partially expose the insulation plate to form the cavity. The LED package also includes an LED chip configured to be mounted inside the cavity, and an encapsulation member filling the cavity, wherein the encapsulation member comprises an epoxy resin. The LED package includes a through-hole configured to be formed on the insulation plate where the LED chip is mounted, wherein the through-hole enables portions of the LED chip to be exposed, and a metal configured to fill the through-hole to form an electrode to be electrically connected to the LED chip.

In accordance with a configuration, there is provided a method of fabricating an LED package, including disposing a metal board on an insulation plate, and removing a portion of the metal board to form a cavity. The method also includes disposing an LED chip within the cavity, filling an encapsulation member into the cavity in which the LED chip is disposed, and forming a through-hole in the insulation plate on which the LED chip is disposed. The method includes filling a metal into the through-hole to form an electrode to electrically connect the electrode to the LED chip.

In accordance with another configuration, there is provided a method of fabricating an LED package, including disposing a metal board on an insulation plate, and forming a through-hole in the insulation plate. The method also includes filling a metal into the through-hole to form an electrode, removing a portion of the metal board to form a cavity, and disposing an LED chip within the cavity to connect the LED chip to the electrode. The method further includes filling an encapsulation member into the cavity.

In accordance with another configuration, there is provided a method, including disposing a metal board on an insulation plate, etching the metal board to partially expose the insulation plate to form a cavity, mounting an LED chip inside the cavity, and filling the cavity with an encapsulation member, wherein the encapsulation member comprises an epoxy resin. The method including forming a through-hole on the insulation plate where the LED chip is mounted to enable portions of the LED chip to be exposed, and filling the through-hole with a metal to form an electrode to be electrically connected to the LED chip.

Also, in accordance with some examples of the configurations described herein, fabrication process of an LED may be simplified, thereby reducing fabrication costs. Because the electrode is formed by plating the through-hole and a surface of the insulation plate, an adhesion may not be used when the electrode is formed.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Figure 1:
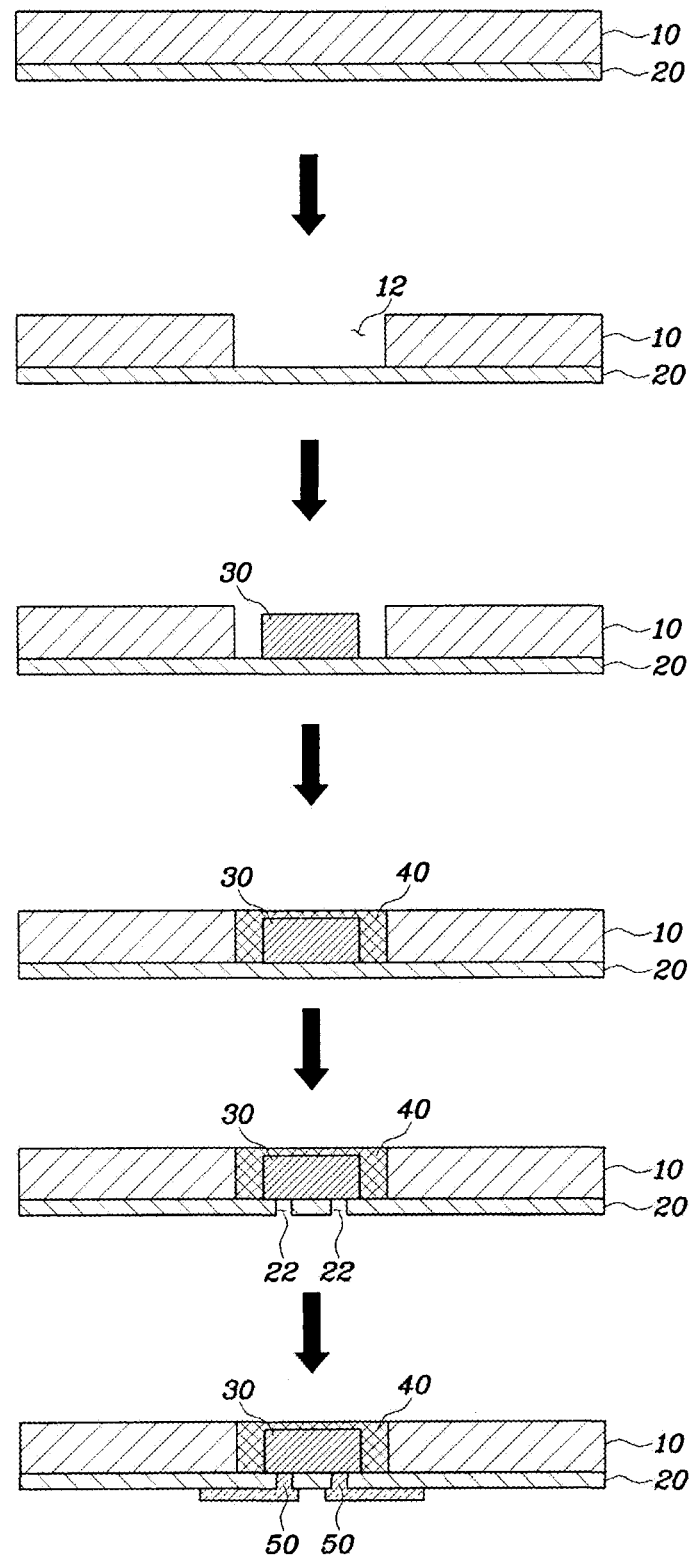
FIG. 1 is a sectional view illustrating an LED package fabricated in accordance with an example embodiment.

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that when an element or layer is referred to as being "on" or "connected to" another element or layer, it can be directly on or connected to another element or layer or through intervening elements or layers. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. These terms do not necessarily imply a specific order or arrangement of the elements, components, regions, layers and/or sections. Thus, a first element, component, region, layer or section discussed below could be termed a second element, component, region, layer or section without departing from the description of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

FIG. 1 is a sectional view illustrating an LED package fabricated in accordance with an example embodiment.

A metal board 10 is disposed on an insulation plate 20. In one example, the metal board 10 and the insulation plate 20 may be coupled with each other. In another example, insulation material may be deposited under the metal board 10 to form the insulation plate 20 disposed under the metal board 10.

An LED chip is to be built on the metal board 10. Also, the metal board 10 is formed of a metal material to improve a heat dissipation effect. For example, the metal board 10 may be formed of aluminum (Al), copper (Cu), zinc (Zn), etc. The insulation plate 20 is formed of a thermal insulation material to improve the heat dissipation effect.

The metal board 10 is partially etched to form a cavity 12.

The metal board 10 is etched until the insulation plate 20 is partially exposed by the cavity 12, which corresponds to an area in which an LED chip is mounted.

The LED chip 30 is installed in the cavity 12, and the cavity 12 is filled with an encapsulation member 40.

The LED chip 30 may be mounted in the cavity 12 formed in the metal board 10 to form an ultra-slim LED package. An epoxy resin used as an encapsulation member of the LED package may be used to form the encapsulation member 40. The encapsulation member 40 may include a fluorescent material that converts light having a short wavelength of the LED chip 30 into multi-wavelength light having a wide range of the wavelength of the light.

A through-hole 22 may be formed in the insulation plate 20 to expose portions of the LED chip 30.

The LED chip 30 is placed on the insulation plate 20, and disposed and encapsulated in the cavity 12. The through-hole 22 enables portions of the LED chip 30 to be exposed. In one example, the portions may include two or more through-holes 22 having the same number as terminals of the LED chip 30.

In one example, a metal may be used to fill the through-hole 22 to form an electrode 50 to be electrically connected to the LED chip 30. The metal may include copper (Cu), nickel phosphate (NiP), etc. In another example, conductive paste composition or conductive polymer may be used to fill the through-hole 22 to form an electrode 50 to be electrically connected to the LED chip 30.

In one illustrative example, a plating process may be performed to fill the metal into the through-hole 22. In one configuration, the metal may be plated to extend from the through-hole 22 up to the insulation plate 20, thereby directly forming the electrode 40 on the insulation plate 20, instead of coupling a lead frame using an adhesion. For example, when a lateral-type LED device is used, the electrode 40 and the LED chip 30 may be directly connected to each other without using a wire.

Figure 2:
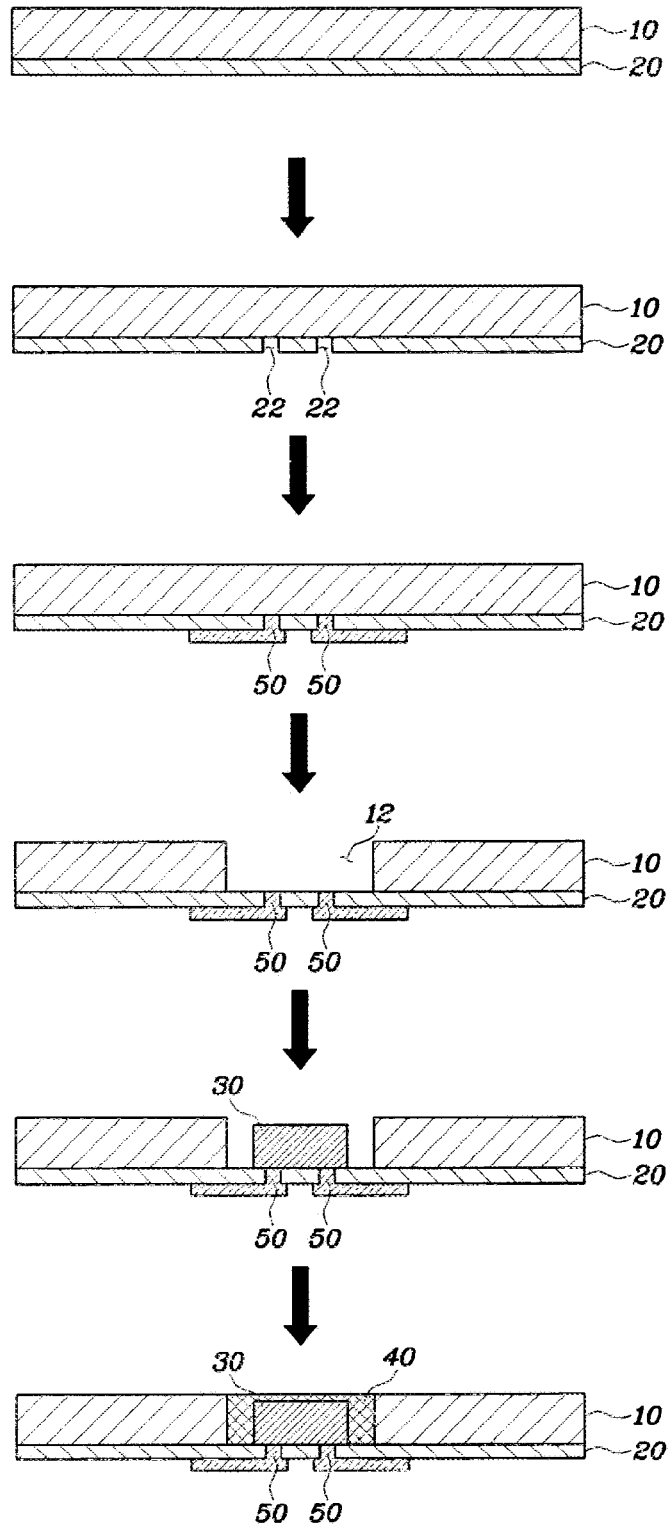
FIG. 2 is a sectional view illustrating an LED package fabricated in accordance with another example embodiment.

FIG. 2 is a sectional view illustrating an LED package fabricated in accordance with another example embodiment.

In the illustrative configuration of FIG. 2, an electrode is formed on an insulation plate.

In one example, a metal board 10 is disposed on an insulation plate 20. In one example, the metal board 10 and the insulation plate 20 may be coupled with each other. In another example, insulation material may be deposited under the metal board 10 to form the insulation plate 20 disposed under the metal board 10.

An LED chip is to be built on the metal board 10. Also, the metal board 10 may be formed of a metal material to improve a heat dissipation effect. For example, the metal board 10 may be formed of aluminum (Al), copper (Cu), zinc (Zn), etc. The insulation plate 20 may be formed of a thermally conductive insulation material to improve the heat dissipation effect.

A through-hole 22 may be formed on the insulation plate 20.

In one configuration, the through-hole 22 is formed in a portion of the insulation plate 20 on which an LED chip will be disposed. In one example, two or more through-holes 22 having the same number as those of terminals of the LED chip may be provided.

In one example, a metal may be used to fill the through-hole 22 to form an electrode 50. The metal may include copper (Cu), nickel phosphate (NiP), etc. In another example, conductive paste composition or conductive polymer may be used to fill the through-hole 22 to form an electrode 50

A plating process may be performed to fill the metal into the through-hole 22. In one example, the metal may be plated to extend from the through-hole 22 up to the insulation plate 20, thereby directly forming the electrode 40 on the insulation plate 20, instead of coupling a lead frame using an adhesion.

The metal board 10 may be partially etched to form a cavity 12. For example, the metal board 10 may be partially etched until the insulation plate 20, disposed on a position at which an electrode is formed, is exposed to form the cavity 12, which corresponds to an area in which the LED chip is built.

The LED chip 30 may then be installed in the cavity 12.

In one configuration, the LED chip 30 may be disposed within the cavity 12 formed in the metal board 10 to form an ultra-slim LED package.

In one example, when the LED chip 30 using a lateral-type LED device is flip-chip bonded to the metal electrode 40 filled into the through-hole 22, the LED chip 30 and the electrode 40 may be connected to each other without using a wire.

Then, the cavity 12 is filled with an encapsulation member 40 in which the LED chip 30 is disposed.

An epoxy resin used as an encapsulation member of the LED package may be used as the encapsulation member 40. The encapsulation member 40 may contain a fluorescent material that converts light, having a short wavelength, of the LED chip 30 into multi-wavelength light, having a wide range of the wavelength.

Figure 3:
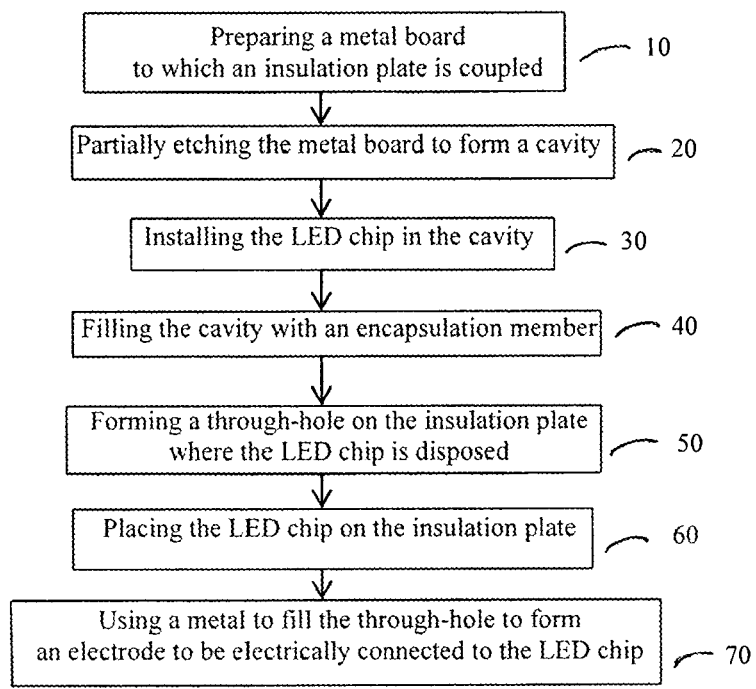
FIG. 3 illustrates a process of fabricating the LED package of FIG. 1, in accordance with an example embodiment.

FIG. 3 illustrates a process of FIG. 3 illustrates a process of fabricating the LED package of FIG. 1, in accordance with an example embodiment.

At operation 10, the process prepares a metal board 10 to which an insulation plate 20 is coupled. At operation 20, the process is configured to, at least, partially etch the metal board 10 to form a cavity 12. The metal board 10 may be etched until the insulation plate 20 is partially exposed to form the cavity 12, which corresponds to an area in which an LED chip is mounted. At operation 30, the process is configured to install the LED chip 30 in the cavity 12. At operation 40, the process is configured to fill the cavity 12 with an encapsulation member 40.

At operation 50, the process is configured to form a through-hole 22 on the insulation plate 20 where the LED chip 30 is disposed. At operation 60, the process is configured to place the LED chip 30 on the insulation plate 20. At operation 70, the process is configured to use a metal to fill the through-hole 22 to form an electrode 50 to be electrically connected to the LED chip 30.

Figure 4:
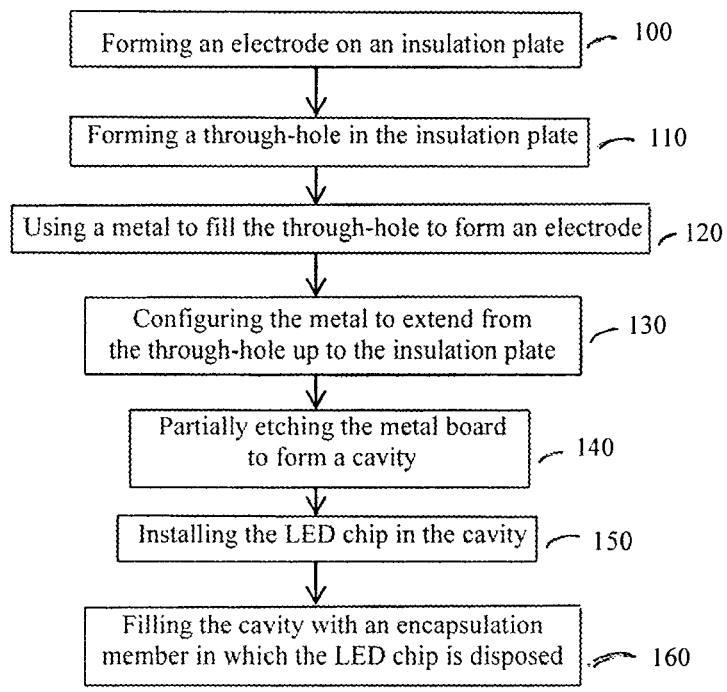
FIG. 4 illustrates a process of fabricating the LED package of FIG. 2, in accordance with another example embodiment.

FIG. 4 illustrates a process of fabricating the LED package of FIG. 2, in accordance with another example embodiment. At operation 100, the process is configured to form an electrode on an insulation plate 20. At operation 110, the process is configured to form a through-hole 22 in the insulation plate 20. At operation 120, the process is configured to use a metal to fill the through-hole 22 to form an electrode 50. At operation 130, the process configures the metal to extend from the through-hole 22 up to the insulation plate 20, thereby directly forming the electrode 40 on the insulation plate 20

At operation 140, the process is configured to, at least, partially etch the metal board 10 to form a cavity 12. At operation 150, the process is configured to install the LED chip 30 in the cavity 12. At operation 160, the process is configured to fill the cavity 12 with an encapsulation member 40 in which the LED chip 30 is disposed.

In the LED package fabricated through the above-described methods, the fabrication process may be simplified to reduce fabrication costs, and also an adhesion is not almost used in the fabrication process.

Also, the illustrative configurations described above demonstrate, at least, a heat dissipation effect that may be superior because heat generated from the LED chip 30 may be dissipated through the metal board 10, the insulation plate 20 formed of the thermal insulation material, and the electrode 40 connected to the LED chip 30.

Figure 5:
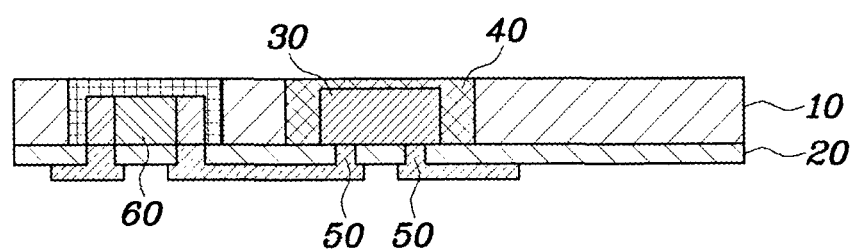
FIG. 5 is a sectional view illustrating an example of a use of an LED package, in accordance with an example embodiment.

FIG. 5 is a sectional view illustrating an example of a use of an LED package in accordance with an example embodiment.

Referring to FIG. 5, an additional cavity may be defined in a metal board 10. Also, an integrated circuit (IC) 60 to operate an LED chip 30 and to control a heat dissipation function is built in the cavity.

In one configuration, the IC 60 is electrically connected to the LED chip 30 through an electrode 50 to constitute an ultra-slim LED package.

Figure 6:
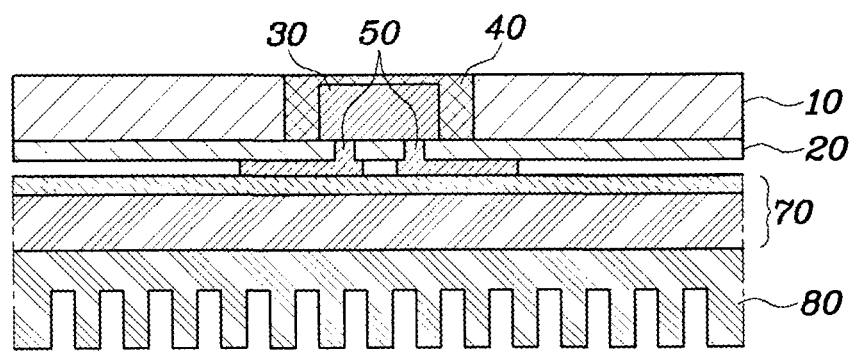
FIG. 6 is a sectional view of another example of the use of the LED package, in accordance with an example embodiment.

FIG. 6 is a sectional view of another example of the use of the LED package in accordance with an example embodiment.

To improve the heat dissipation effect of the LED package, the LED package may be connected to a metal core printed circuit board (MCPCB) 70. In addition, a heat sink 80 may be additionally attached to the LED package.

In the LED package, as described above, the use of the wire and adhesion within the package may be minimized, and simultaneously, the heat dissipation efficiency may be improved to significantly reduce the limitations occurring by heat dissipated from an LED.

Also, in the method of fabricating the LED package, the fabrication process may be simplified to reduce the fabrication costs.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An LED package, comprising:
   an insulation plate;
   a metal board disposed on the insulation plate and etched to form a cavity, wherein the metal board is etched to partially expose the insulation plate to form the cavity;
   an LED chip configured to be mounted directly on the insulation plate inside the cavity;
   an encapsulation member filling the cavity, wherein the encapsulation member comprises an epoxy resin;
   a through-hole configured to be formed on the insulation plate where the LED chip is mounted, wherein the through-hole enables portions of the LED chip to be exposed; and
   a metal configured to fill the through-hole to form an electrode to be electrically connected to the LED chip.

2. The LED package of claim 1, wherein the encapsulation member further comprises a fluorescent material configured to convert light having a short wavelength of the LED chip into multi-wavelength light having a wide range of the wavelength of the light.

3. The LED package of claim 1, wherein the portions comprise two or more through-holes having a same number terminals of the LED chip.

4. The LED package of claim 1, wherein the encapsulation member comprises a fluorescent material that converts light, having a short wavelength, of the LED chip into multi-wavelength light, having a wide range of the wavelength.

5. The LED package of claim 1, wherein the metal board is formed of a metal material.

6. The LED package of claim 1, wherein the insulation plate is formed of a thermal insulation material.

7. The LED package of claim 1, wherein a plating process is performed to fill the metal into the through-hole.

8. The LED package of claim 1, wherein the metal is plated to extend from the through-hole up to the insulation plate to form the electrode on the insulation plate.

* * * * *